(12) United States Patent
Oshio et al.

(10) Patent No.: US 6,515,476 B1
(45) Date of Patent: Feb. 4, 2003

(54) MAGNETIC FIELD INHOMOGENEITY MEASUREMENT METHOD AND APPARATUS, PHASE CORRECTION METHOD AND APPARATUS, AND MAGNETIC RESONANCE IMAGING APPARATUS

(75) Inventors: Koichi Oshio, Tokyo (JP); Mitsuharu Miyoshi, Tokyo (JP)

(73) Assignee: GE Yokogawa Medical Systems, Limited, Tokyo (JP)

( * ) Notice: Subject to any disclaimer, the term of this patent is extended or adjusted under 35 U.S.C. 154(b) by 0 days.

(21) Appl. No.: 09/575,595

(22) Filed: May 22, 2000

(30) Foreign Application Priority Data

Jun. 24, 1999 (JP) .......................................... 11-177658

(51) Int. Cl.[7] ................................................ G01V 3/00
(52) U.S. Cl. ........................ 324/309; 324/307; 324/320
(58) Field of Search .................................. 324/309, 307

(56) References Cited

U.S. PATENT DOCUMENTS

| | | | | |
|---|---|---|---|---|
| 4,661,775 A | * | 4/1987 | Kormos et al. ............. | 324/307 |
| 4,720,679 A | * | 1/1988 | Patrick et al. .............. | 324/309 |
| 4,797,615 A | * | 1/1989 | Rotem et al. .............. | 324/307 |
| 4,871,967 A | * | 10/1989 | Rotem et al. .............. | 324/307 |
| 5,498,963 A | * | 3/1996 | Schneider et al. .......... | 324/307 |
| 5,602,480 A | * | 2/1997 | Onodera et al. ............ | 324/309 |
| 5,617,029 A | * | 4/1997 | Schneider .................. | 324/319 |
| 5,652,514 A | * | 7/1997 | Zhang et al. ............... | 324/307 |
| 5,701,074 A | * | 12/1997 | Zhu ........................... | 324/307 |
| 6,091,243 A | * | 7/2000 | Xiang et al. ................ | 324/307 |
| 6,147,492 A | * | 11/2000 | Zhang et al. ............... | 324/307 |
| 6,177,795 B1 | * | 1/2001 | Zhu et al. ................... | 324/307 |
| 6,259,253 B1 | * | 7/2001 | Ellingson ................... | 324/322 |
| 6,263,228 B1 | * | 7/2001 | Zhang et al. ............... | 128/899 |

FOREIGN PATENT DOCUMENTS

JP 0070239 3/2000

OTHER PUBLICATIONS

"Multi–point dixon imaging with reduced time and increased reliability" Jingfei Ma, ISMRM 98, pp 622.

"Single–scan single point Dixon method for automatic separation of water and fat pixels at 0.35 tesla" Weiguo Zhang, Andrew Li, ISMRM 98, p 1867.

"Fat suppression with single quadrature acquisition" Quing–san Xiang, ISMRM 98, p 1880.

Separation of water and fat MR images in a single scan at .35 T using 'sandwich' echoes, Weiguo Zhang, David Goldhaber, DavidM. Kramer, JMRI 1996, vol. 6, pp 909–917.

* cited by examiner

*Primary Examiner*—Edward Lefkowitz
*Assistant Examiner*—Dixomara Vargas
(74) *Attorney, Agent, or Firm*—Moonray Kojima

(57) ABSTRACT

In order to perform imaging with water and fat separated in an efficient manner, a tomographic image is obtained having a phase difference of $\pi/2$ between water and fat using magnetic resonance (700), the phase of the tomographic image is multiplied by n (706), the phase after being corrected for wraparound is multiplied by 1/n (714, 716), and a phase image representing magnetic field inhomogeneity is generated. The tomographic image is corrected for phase using the phase image (718), and is separated into a water image and a fat image (726).

12 Claims, 8 Drawing Sheets

US 6,515,476 B1

MAGNETIC FIELD INHOMOGENEITY MEASUREMENT METHOD AND APPARATUS, PHASE CORRECTION METHOD AND APPARATUS, AND MAGNETIC RESONANCE IMAGING APPARATUS

BACKGROUND OF THE INVENTION

The present invention relates to a magnetic field inhomogeneity measurement method and apparatus, a phase correction method and apparatus and a magnetic resonance imaging apparatus, and more particularly to a method and apparatus for measuring magnetic field inhomogeneity in a space to be imaged based on the phase of pixel data of an image obtained by magnetic resonance imaging, a method and apparatus for correcting the phase of pixel data based on the measured magnetic field inhomogeneity, and a magnetic resonance imaging apparatus for obtaining images with water and fat separated based on the phase-corrected pixel data.

A magnetic resonance imaging apparatus is configured to generate a static magnetic field in a space containing a subject to be imaged, generate gradient and high frequency magnetic fields in the static magnetic field space, and produce (i.e., reconstruct) an image based on magnetic resonance signals generated from the magnetic field space. Since the magnetic resonance signals from fat have a different frequency than the magnetic resonance signals from water due to chemical shift, water and fat can be separately imaged utilizing a phase difference based on the difference in frequency.

The phase of the magnetic resonance signals is affected by inhomogeneity of the static magnetic field strength, and imaging by a so-called Dixon method is performed to separately image water and fat without being affected by the magnetic field inhomogeneity. This technique involves obtaining an image with the phase of magnetic resonance signals from water (which will be simply referred to as a water phase hereinbelow) in phase with that of magnetic resonance signals from fat (which will be simply referred to as a fat phase hereinbelow) and an image with the water phase opposite to the fat phase, and generate a water image through the sum of these images and a fat image through the difference between these images.

However, the Dixon method requires normal imaging operations for two images to obtain one image, resulting in low efficiency. Moreover, since the phase change rate for fat decreases relative to that for water as the static magnetic field strength lowers, a longer TE (echo time) is required to obtain signals with water and fat in phase by using, for example, a gradient echo, and accordingly signal decay increases, making it impractical to employ the Dixon method in a magnetic field having a strength as low as 0.2 T, for example.

SUMMARY OF THE INVENTION

It is therefore an object of the present invention to provide a magnetic field inhomogeneity measurement method and apparatus for performing imaging with water and fat separated in an efficient manner, a phase correction method and apparatus based on the magnetic field inhomogeneity, and a magnetic resonance imaging apparatus for performing imaging with water and fat separated in an efficient manner.

In accordance with a first aspect of the invention, there is provided a magnetic field inhomogeneity measurement method comprising the steps of: obtaining a tomographic image of a subject within a static magnetic field space using magnetic resonance, the tomographic image having a phase difference of $2\pi/n$ ($n \geq 2$) between pixel data of water and fat; multiplying the phase of pixel data of the tomographic image by n; correcting wraparound caused by the phase multiplied by n exceeding a range between $\pm\pi$; and multiplying the wraparound-corrected phase by $1/n$ to obtain a phase representing magnetic field inhomogeneity in the static magnetic field space.

In accordance with a second aspect of the invention, there is provided a magnetic field inhomogeneity measurement apparatus comprising: imaging means for obtaining a tomographic image of a subject within a static magnetic field space using magnetic resonance, the tomographic image having a phase difference of $2\pi/n$ ($n \geq 2$) between pixel data of water and fat; phase-multiplier means for multiplying the phase of pixel data of the tomographic image by n; wraparound-correction means for correcting wraparound caused by the phase multiplied by n exceeding a range between $\pm\pi$; and magnetic field inhomogeneity-measurement means for multiplying the wraparound-corrected phase by $1/n$ to obtain a phase representing magnetic field inhomogeneity in the static magnetic field space.

In accordance with a third aspect of the invention, there is provided a phase correction method comprising the steps of: obtaining a tomographic image of a subject within a static magnetic field space using magnetic resonance, the tomographic image having a phase difference of $2\pi/n$ ($n \geq 2$) between pixel data of water and fat; multiplying the phase of pixel data of the tomographic image by n; correcting wraparound caused by the phase multiplied by n exceeding a range between $\pm\pi$; multiplying the wraparound-corrected phase by $1/n$ to obtain a phase representing magnetic field inhomogeneity in the static magnetic field space; and correcting the phase of pixel data of the tomographic image using the phase obtained.

In accordance with a fourth aspect of the invention, there is provided a phase correction apparatus comprising: imaging means for obtaining a tomographic image of a subject within a static magnetic field space using magnetic resonance, the tomographic image having a phase difference of $2\pi/n$ ($n \geq 2$) between pixel data of water and fat; phase-multiplier means for multiplying the phase of pixel data of the tomographic image by n; wraparound-correction means for correcting wraparound caused by the phase multiplied by n exceeding a range between $\pm\pi$; magnetic field inhomogeneity-measurement means for multiplying the wraparound-corrected phase by $1/n$ to obtain a phase representing magnetic field inhomogeneity in the static magnetic field space; and phase-correction means for correcting the phase of pixel data of the tomographic image using the phase obtained.

In accordance with a fifth aspect of the invention, there is provided a magnetic resonance imaging apparatus comprising: imaging means for obtaining a tomographic image of a subject within a static magnetic field space using magnetic resonance, the tomographic image having a phase difference of $2\pi/n$ ($n \geq 2$) between pixel data of water and fat; phase-multiplier means for multiplying the phase of pixel data of the tomographic image by n; wraparound-correction means for correcting wraparound caused by the phase multiplied by n exceeding a range between $\pm\pi$; magnetic field inhomogeneity-measurement means for multiplying the wraparound-corrected phase by $1/n$ to obtain a phase representing magnetic field inhomogeneity in the static magnetic field space; phase-correction means for correcting the phase of pixel data of the tomographic image using the phase obtained; and image-producing means for separately producing a water image and a fat image using the phase difference in the phase-corrected pixel data.

In accordance with a sixth aspect of the invention, there is provided a magnetic resonance imaging method comprising the steps of: obtaining a tomographic image of a subject within a static magnetic field space using magnetic resonance, the tomographic image having a phase difference of $2\pi/n$ ($n \geq 2$) between pixel data of water and fat; multiplying the phase of pixel data of the tomographic image by n; correcting wraparound caused by the phase multiplied by n exceeding a range between $\pm\pi$; multiplying the wraparound-corrected phase by $1/n$ to obtain a phase representing magnetic field inhomogeneity in the static magnetic field space; correcting the phase of pixel data of the tomographic image using the phase obtained; and separately producing a water image and a fat image using the phase difference in the phase-corrected pixel data.

(Effect)

According to the present invention, water and fat are made in phase by multiplying the phase of pixel data by n, and wraparound that exceeds a range between $\pm\pi$ is corrected and then is multiplied by $1/n$ to obtain a phase distribution corresponding to magnetic field inhomogeneity. The phase distribution is used to correct the phase of pixel data, thereby eliminating the effect of the magnetic field inhomogeneity. Using the pixel data from which the effect of the magnetic field inhomogeneity has been eliminated, separate water and fat images are provided using the phase difference.

Thus, the present invention can provide a magnetic field inhomogeneity measurement method and apparatus for performing imaging with water and fat separated in an efficient manner, a phase correction method and apparatus based on the magnetic field inhomogeneity, and a magnetic resonance imaging apparatus for performing imaging with water and fat separated in an efficient manner.

Further objects and advantages of the present invention will be apparent from the following description of the preferred embodiments of the invention as illustrated in the accompanying drawings.

DETAILED DESCRIPTION OF THE INVENTION

Figure 1:
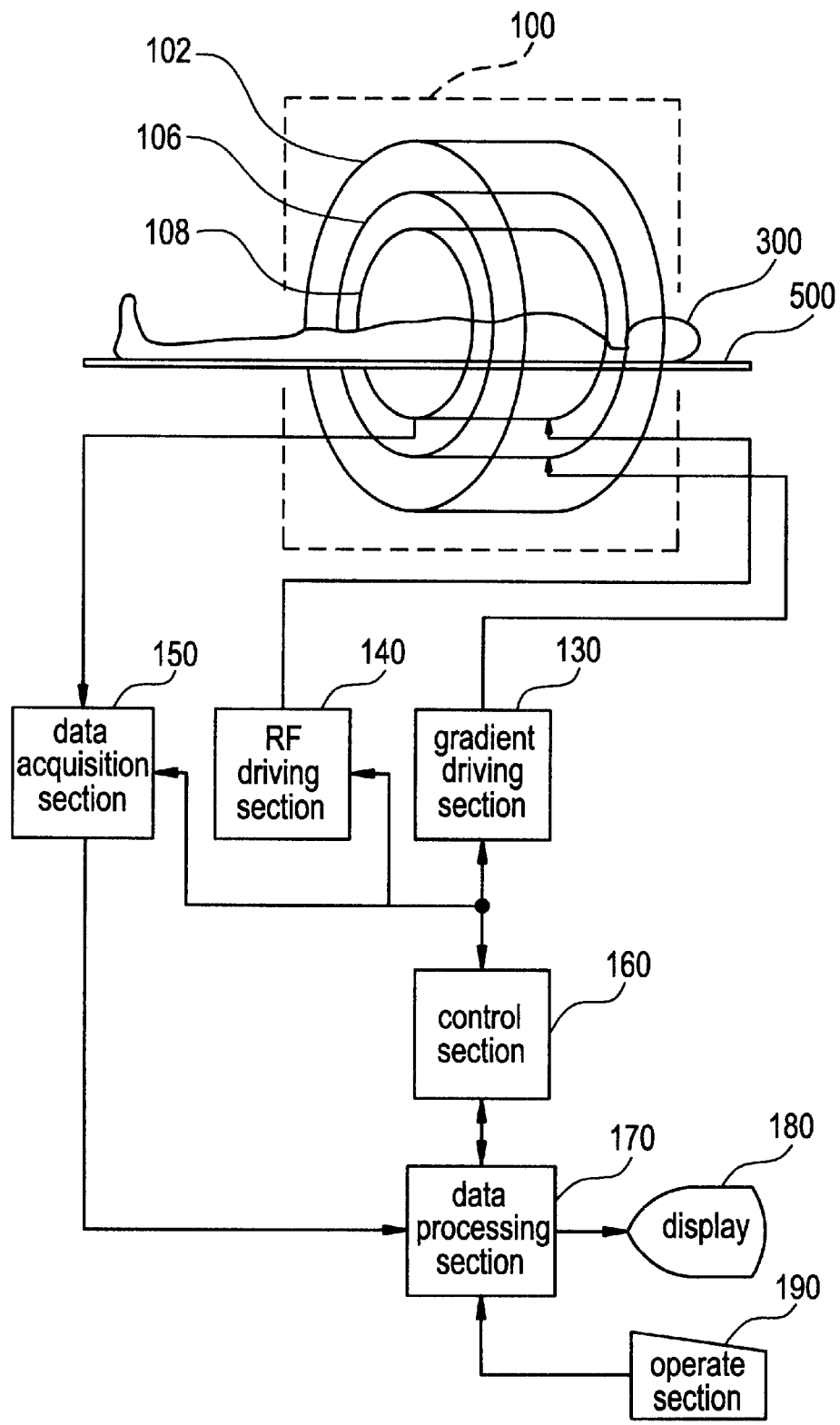
FIG. 1 is a block diagram of an apparatus in accordance with an embodiment of the present invention.

Several embodiments of the present invention will now be described in more detail with reference to the accompanying drawings. FIG. 1 shows a block diagram of a magnetic resonance imaging apparatus, which is an embodiment of the present invention. The configuration of the apparatus represents an embodiment of the apparatus in accordance with the present invention, and the operation of the apparatus represents an embodiment of the method in accordance with the present invention.

As shown in FIG. 1, the present apparatus has a magnet system 100. The magnet system 100 has a main magnetic field coil section 102, a gradient coil section 106 and an RF (radio frequency) coil section 108. These coil sections have a generally cylindrical outer shape and are concentrically disposed. A subject to be imaged 300 is rested on a cradle 500 and carried into and out of the internal space of the magnet system 100 by carrier means (not shown). The subject to be imaged 300 is an embodiment of the subject of the present invention.

The main magnetic field coil section 102 generates a static magnetic field in the internal space of the magnet system 100. The direction of the static magnetic field is generally in parallel with the direction of the body axis of the subject to be imaged 300, i.e., a so-called horizontal magnetic field is generated. The main magnetic field coil section 102 comprises a superconductive coil, for example. It will be easily recognized that the main magnetic field coil section 102 is not limited to comprising a superconductive coil, but may comprise a normal conductive coil.

The gradient coil section 106 generates gradient magnetic fields for imparting gradients to the static magnet field strength. The gradient magnetic fields to be generated include three types of magnetic fields: a slice gradient magnetic field, a readout gradient magnetic field and a phase encoding gradient magnetic field, and the gradient coil section 106 has three gradient coils (not shown) corresponding to these three gradient magnetic fields.

The RF coil section 108 generates a high frequency magnetic field in the static magnetic field space to excite spins within the subject to be imaged 300. The generation of the high frequency magnetic field will be referred to as transmission of an RF excitation signal hereinbelow. The RF coil section 108 also receives an electromagnetic wave generated by the excited spins, i.e., a magnetic resonance signal. The RF coil section 108 has a transmit coil and a receive coil (not shown). The transmit and receive coils may be either the same coil or separate dedicated coils.

The gradient coil section 106 is connected with a gradient driving section 130 for supplying driving signals to the gradient coil section 106 to generate the gradient magnetic fields. The gradient driving section 130 has three driving circuits (not shown) corresponding to the three gradient coils in the gradient coil section 106.

The RF coil section 108 is connected with an RF driving section 140 for supplying driving signals to the RF coil section 108 to transmit the RF excitation signals, thereby exciting the spins within the subject to be imaged 300. The RF coil section 108 is also connected with a data acquisition section 150 for gathering signals received by the RF coil section 108 and collecting the signals as digital data.

The gradient driving section 130, RF driving section 140 and data acquisition section 150 are connected with a control section 160 for controlling these sections 130–150.

The output of the data acquisition section 150 is connected to a data processing section 170. The data processing section 170 stores data gathered from the data acquisition section 150 in a memory (not shown). Thus, a data space is formed in the memory, which constitutes a two-dimensional Fourier space. The data processing section 170 performs an inverse two-dimensional Fourier transformation on the data in the two-dimensional Fourier space to reconstruct an image of the subject to be imaged 300.

The data processing section 170 is connected to the control section 160. The data processing section 170 is superior to the control section 160 and governs the section 160. The data processing section 170 is connected with a display section 180 that displays the reconstructed image and several information output from the data processing section 170, and an operating section 190 that is operated by a human operator and inputs several commands, information and so forth to the data processing section 170.

Figure 2:
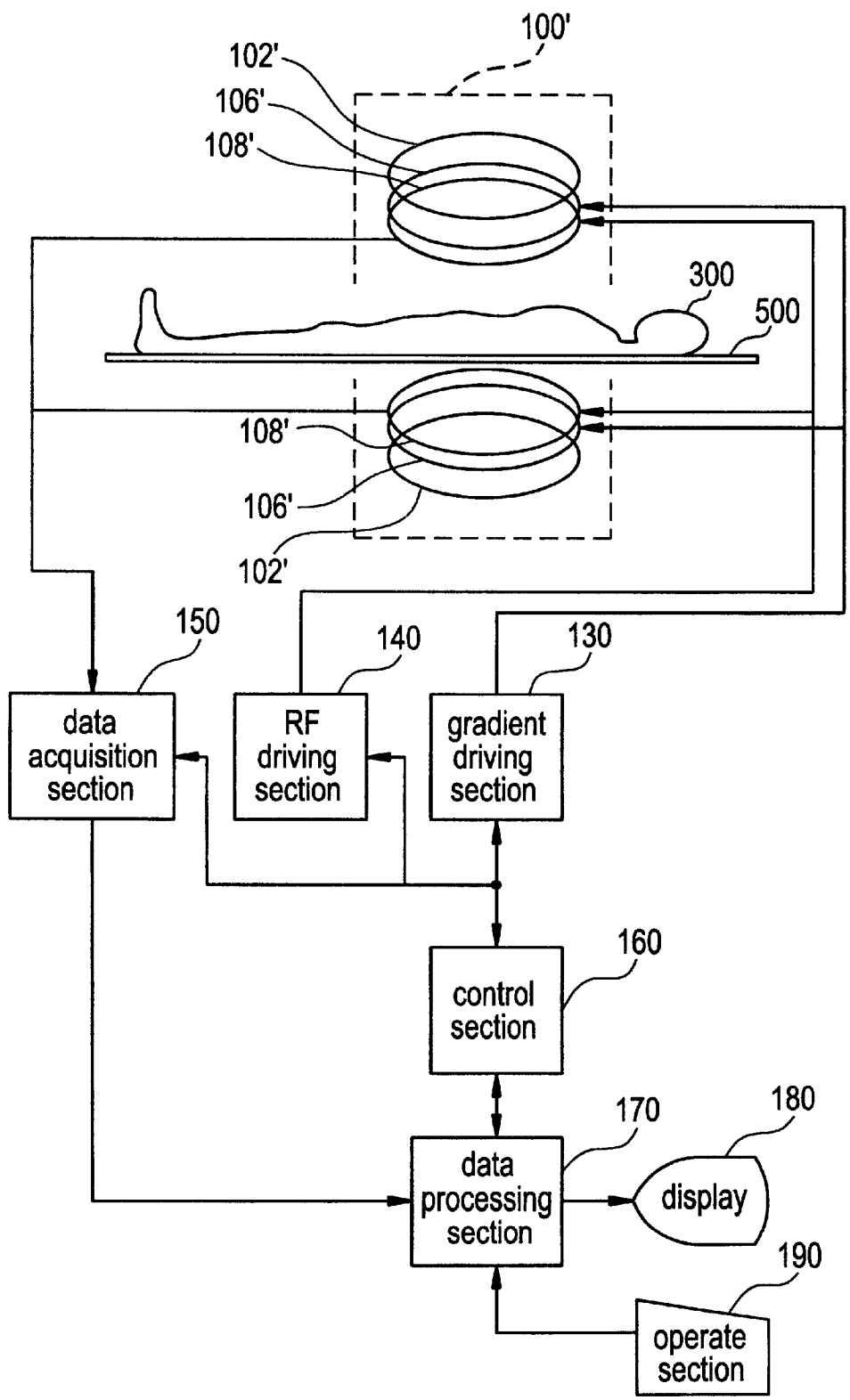
FIG. 2 is a block diagram of an apparatus in accordance with another embodiment of the present invention.

FIG. 2 shows a block diagram of another magnetic resonance imaging apparatus, which is an embodiment of the present invention. The configuration of the apparatus represents an embodiment of the apparatus in accordance with the present invention, and the operation of the apparatus represents an embodiment of the method in accordance with the present invention.

The apparatus shown in FIG. 2 has a different magnet system 100' than the apparatus shown in FIG. 1. Components except the magnet system 100' are configured in a similar manner to those in the apparatus shown in FIG. 1, and similar parts are designated by similar reference numerals and explanation thereof will be omitted.

The magnet system 100' has a main magnetic field magnet section 102', a gradient coil section 106' and an RF coil section 108'. The main magnetic field magnet section 102' and the coil sections 106' and 108' each comprise a pair of respective members facing each other with a space interposed. These sections have a generally disk-like outer shape and are disposed with a common center axis. The subject to be imaged 300 is rested on the cradle 500 and carried into and out of the internal space of the magnet system 100' by carrier means (not shown).

The main magnetic field magnet section 102' generates a static magnetic field in the internal space of the magnet system 100'. The direction of the static magnetic field is generally orthogonal to the direction of the body axis of the subject to be imaged 300, i.e., a so-called vertical magnetic field is generated. The main magnetic field magnet section 102' comprises a permanent magnet, for example. It will be easily recognized that the main magnetic field magnet section 102' is not limited to comprising a permanent magnet, but may comprise a superconductive or normal conductive electromagnet, etc.

The gradient coil section 106' generates gradient magnetic fields for imparting gradients to the static magnet field strength. The gradient magnetic fields to be generated include three types of magnetic fields: a slice gradient magnetic field, a readout gradient magnetic field and a phase encoding gradient magnetic field, and the gradient coil section 106' has three gradient coils (not shown) corresponding to these three gradient magnetic fields.

The RF coil section 108' transmits an RF excitation signal to the static magnetic field space to excite spins within the subject to be imaged 300. The RF coil section 108 also receives a magnetic resonance signal generated by the excited spins. The RF coil section 108' has a transmit coil and a receive coil (not shown). The transmit and receive coils may be either the same coil or separate dedicated coils.

Figure 3:
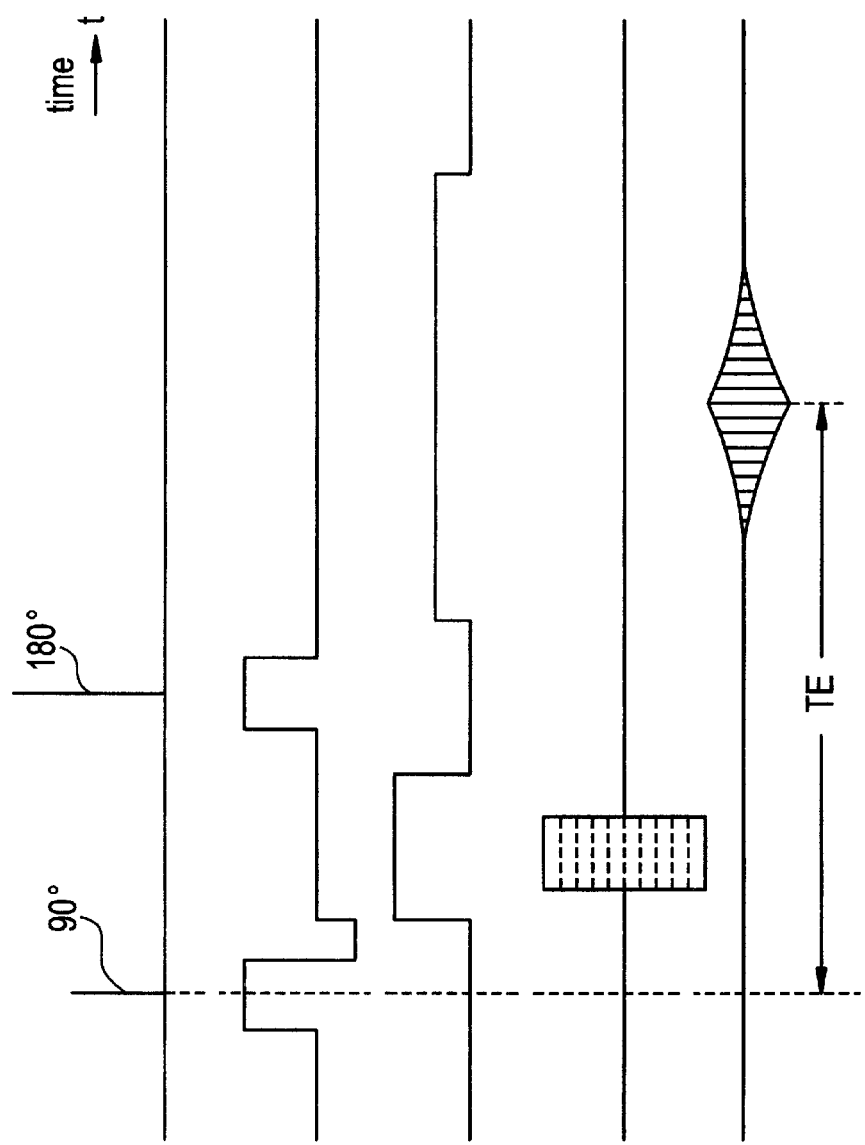
FIG. 3 illustrates an exemplary pulse sequence executed by the apparatus shown in FIG. 1 or 2.

FIG. 3 shows an exemplary pulse sequence for use in magnetic resonance imaging. The illustrated pulse sequence is one for a spin echo (SE) method.

Specifically, (1) is a sequence of 90° and 180° pulses for RF excitation of the SE method, and (2), (3), (4) and (5) are sequences of a slice gradient Gs, a readout gradient Gr, a phase encoding gradient Gp and a spin echo MR, respectively, of the SE method. It should be noted that the 90° and 180° pulses are represented by their respective central signals. The pulse sequence proceeds from the left to the right along a time axis t.

As shown, the 90° pulse results in 90° excitation of the spins. At the same time, the slice gradient Gs is applied to achieve selective excitation for a certain slice. After a predetermined period from the 90° excitation, 180° excitation by the 180° pulse, or spin inversion, is performed. Again, the slice gradient Gs is applied at the same time to achieve selective inversion for the same slice.

During the time between the 90° excitation and the spin inversion, the readout gradient Gr and phase encoding gradient Gp are applied. The readout gradient Gr dephases the spins, and the phase encoding gradient Gp phase-encodes the spins.

After the spin inversion, the spins are rephased by the readout gradient Gr to generate a spin echo MR. The spin echo MR is collected by the data acquisition section 150 as view data. Such a pulse sequence is repeated 128–256 times in a cycle of TR (repetition time). The phase encoding gradient Gp is varied for each repetition to provide different phase encoding each time. Thus, view data for 128–256 views are obtained.

The spin echo MR is an RF signal having a symmetrical waveform with respect to the echo center. The central echo occurs after TE (echo time) from the 90° excitation. By appropriately selecting the time TE, the phase difference between echoes of water and fat can be $2\pi/n$ ($n \geq 2$). For example, when n=4, the value of TE for a phase difference of $\pi/2$ is of the order of $2\tau+8.6$ ms or $2\tau-8.6$ ms under a static magnetic field strength of 0.2 T, wherein $\tau$ is a time interval from 90° excitation to 180° excitation. The spin echo obtained at such TE has a sufficient signal strength.

Figure 4:
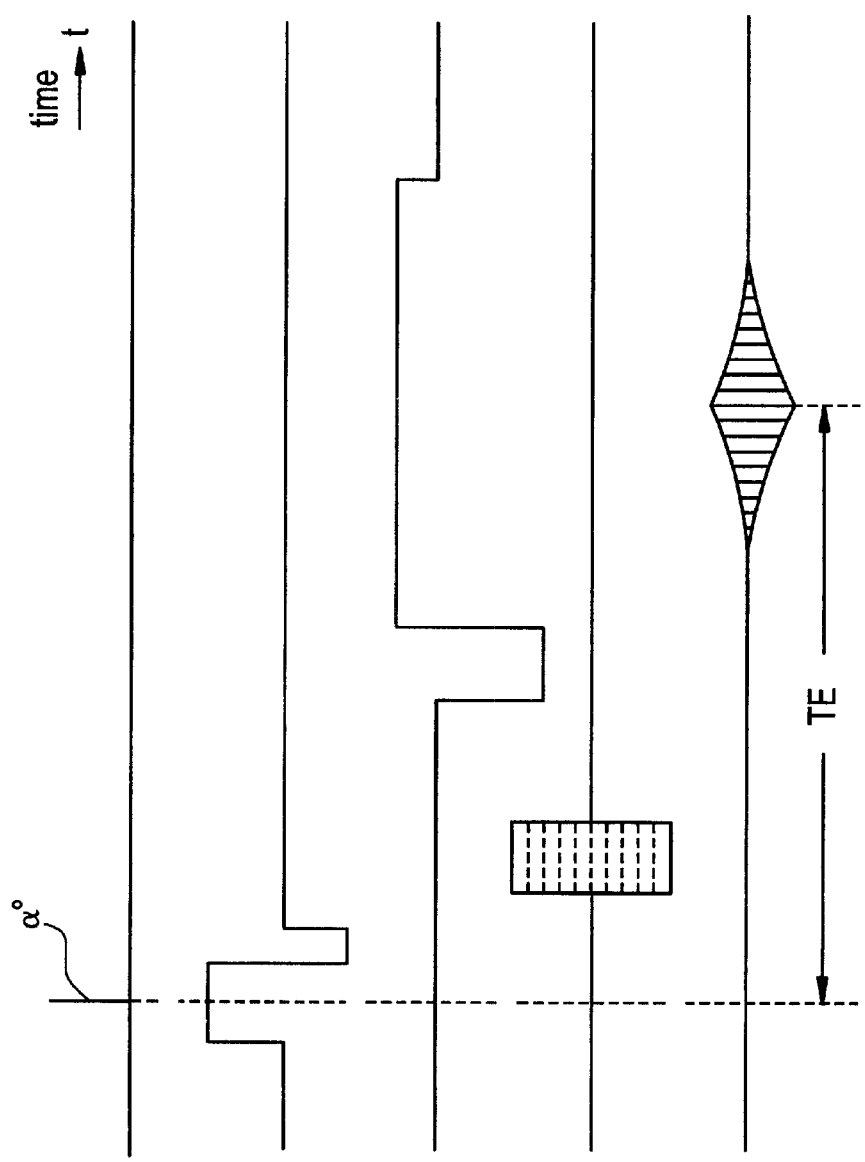
FIG. 4 illustrates another exemplary pulse sequence executed by the apparatus shown in FIG. 1 or 2.

Another example of the pulse sequence for magnetic resonance imaging is shown in FIG. 4. This pulse sequence is one for a gradient echo (GRE) method.

Specifically, (1) is a sequence of an α° pulse for RF excitation of the GRE method, and (2), (3), (4) and (5) are sequences of a slice gradient Gs, a readout gradient Gr, a phase encoding gradient Gp and a gradient echo MR, respectively, of the GRE method. It should be noted that the α° pulse is represented by its central signal. The pulse sequence proceeds from the left to the right along a time axis t.

As shown, the α° pulse results in α° excitation of the spins, wherein α is not greater than 90. At the same time, the slice gradient Gs is applied to achieve selective excitation for a certain slice.

After the α° excitation, the spins are phase-encoded by the phase encoding gradient Gp. Next, the spins are first dephased and are subsequently rephased by the readout gradient Gr to generate a gradient echo MR. The gradient echo MR is collected by the data acquisition section 150 as view data. Such a pulse sequence is repeated 128–256 times in a cycle of TR. The phase encoding gradient Gp is varied for each repetition to provide different phase encoding each time. Thus, view data for 128–256 views are obtained.

The gradient echo MR is an RF signal having a symmetrical waveform with respect to the echo center. The central echo occurs after TE from the α° excitation. By appropriately selecting the time TE, the phase difference between echoes of water and fat can be $2\pi/n$ ($n \geq 2$). For example, when n=4, the value of TE for a phase difference of π/2 is of the order of 8.6 ms under a static magnetic field strength of 0.2 T. The gradient echo obtained at such TE has a sufficient signal strength.

The view data obtained by the pulse sequence of FIG. 3 or 4 are collected into the memory in the data processing section 170. It will be easily recognized that the pulse sequence is not limited to the SE or GRE method, but may be of any other appropriate technique such as a fast spin echo (FSE) method.

The data processing section 170 performs an inverse two-dimensional Fourier transformation on the view data to reconstruct a tomographic image of the subject to be imaged 300. The reconstructed image is stored in the memory. The configuration and function of the present apparatus in the preceding description represent an embodiment of the imaging means of the present invention.

The data processing section 170 produces an image rendering water and an image rendering fat from the reconstructed image. The image rendering water will be referred to as a water image, and the image rendering fat as a fat image hereinbelow.

In producing the water and fat images, the data processing section 170 generates a strength distribution of the static magnetic field. The data processing section 170 is an embodiment of the magnetic field inhomogeneity measurement apparatus of the present invention. The configuration of the data processing section 170 represents an embodiment of the apparatus in accordance with the present invention, and the operation thereof represents an embodiment of the method in accordance with the present invention.

The data processing section 170 also performs phase correction for eliminating the effect of the magnetic field inhomogeneity based on the magnetic field inhomogeneity. The data processing section 170 is an embodiment of the phase correction apparatus of the present invention. The configuration of the data processing section 170 represents an embodiment of the apparatus in accordance with the present invention, and the operation thereof represents an embodiment of the method in accordance with the present invention.

Figure 5:
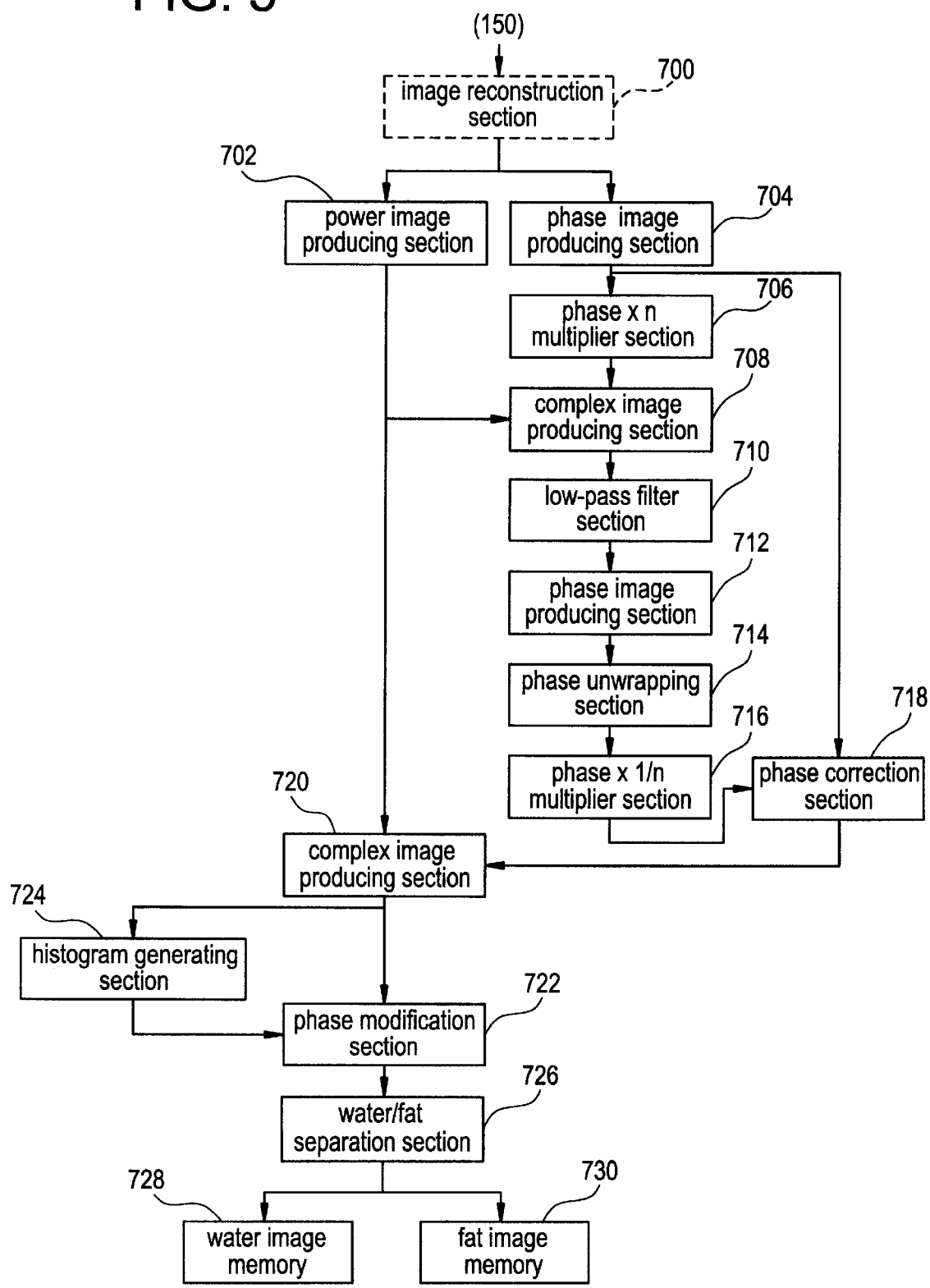
FIG. 5 is a block diagram of a data processing section in the apparatus shown in FIG. 1 or 2.

FIG. 5 shows a block diagram of the data processing section 170 with respect to separate production of water and fat images. The function of the blocks in FIG. 5 is implemented by, for example, a computer program.

As shown, the data processing section 170 has a power image producing section 702 and a phase image producing section 704, which are supplied with a reconstructed image from a preceding image reconstruction section 700. Pixel data of the reconstructed image is represented by a complex number. That is, the pixel data has a real component and an imaginary component. The real component will be referred to as a real part and the imaginary component as an imaginary part hereinbelow.

The power image producing section 702 generates the power of complex data for each pixel to produce an image using the power as each pixel value, i.e., a power image. The phase image producing section 704 generates the phase of complex data for each pixel, i.e., the arc tangent of the real part and the imaginary part, to produce an image using the phase as each pixel value, i.e., a phase image.

Figure 6A:
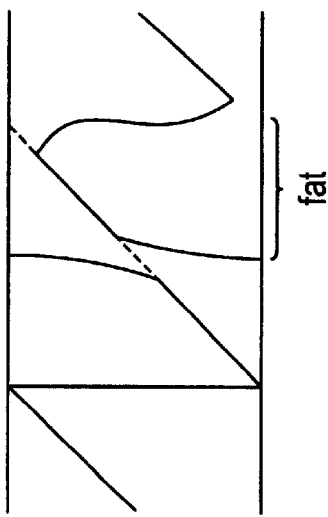
FIGS. 6–9 illustrate the function of the data processing section shown in FIG. 5.

FIG. 6(a) shows a schematic of the phase image, in which a one-dimensional profile of the phase image is illustrated when the tomographic image comprises a fat image and a water image surrounding the fat image. FIG. 6(a) illustrates the case in which the phase difference between the water and fat images is π/2, i.e., n is set to 4 for the phase difference of 2π/n. While the case of n=4 will be described hereinbelow, the description also applies to other values of n.

If the static magnetic field is homogeneous, the one-dimensional profile of the phase image (which will be simply referred to as a phase image) is to have a shape indicated by dot-dash line in FIG. 6(a) because the phase of water image is zero. However, if the static magnetic field has linearly slanting inhomogeneity, for example, the phase image will have a shape indicated by solid line.

Figure 6B:
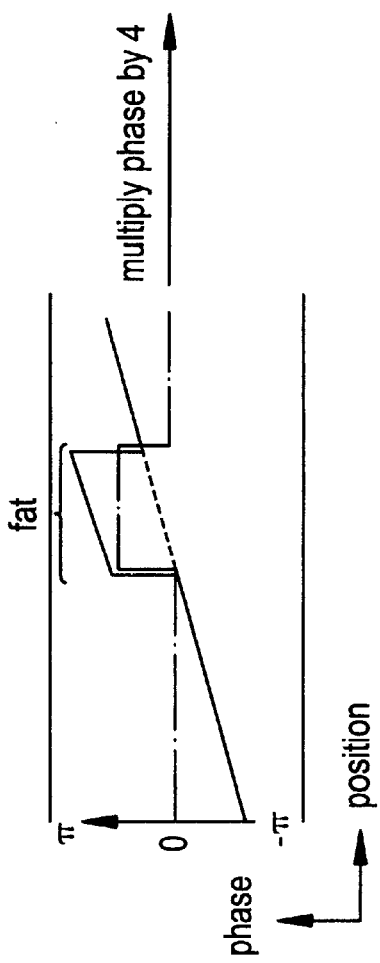

The phase image is input to a phase×n multiplier section 706, which is an embodiment of the phase multiplier means of the present invention. The phase×n multiplier section 706 multiplies the pixel values of the phase image by n (=4). Thus, a phase image as shown in FIG. 6(b) is obtained. As shown, the phase difference between water and fat becomes 2π by multiplication by 4, causing water and fat to be in phase. In the phase image, so-called wraparound occurs in which a portion beyond the range ±π turns into the range ±π. In addition, discontinuity or abrupt change of the phase occurs at the boundary between water and fat.

Such a phase image is input to a complex image producing section 708. The complex image producing section 708 is also supplied with the power image from the power image producing section 702. The complex image producing section 708 produces a complex image based on the phase image and the power image.

The real part of the complex image can be obtained as the cosine of the power image data, and the imaginary part can be obtained as the sine of the power image data. It should be noted that the angle for use in the cosine and sine calculation is a phase angle.

Figure 7A:
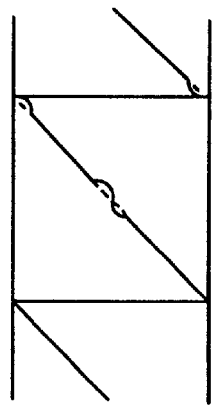
Figure 7B:
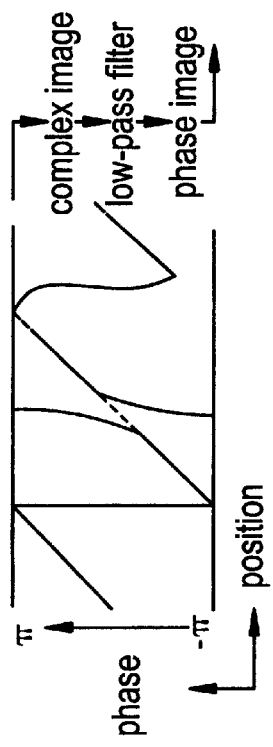

The complex image is input to a phase image producing section 712 through a low-pass filter section 710. The phase image producing section 712 produces a phase image from the low-pass filtered complex image. In the phase image to be produced, the discontinuous or abrupt changing phase portion as shown in FIG. 7(a) is made continuous or alleviated by the low-pass filtering as exemplarily shown in FIG. 7(b).

Figure 8C:
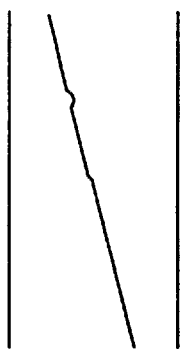
Figure 8B:
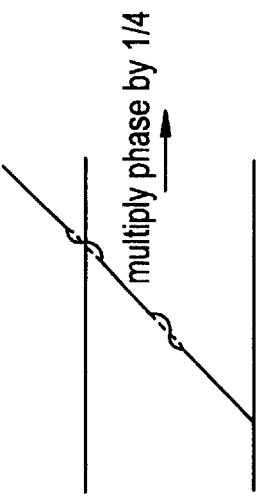
Figure 8A:
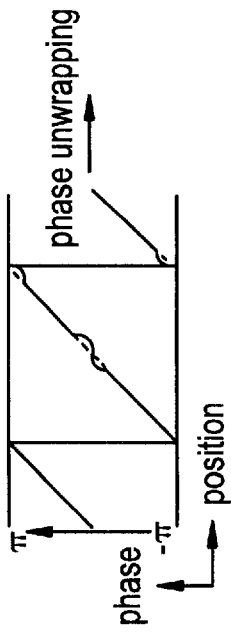

Such a phase image is input to a phase unwrapping section 714, which is an embodiment of the wraparound-correction means of the present invention. The phase unwrapping section 714 unwraps the wrapping phase shown in FIG. 8(a) into the phase as shown in FIG. 8(b).

The unwrapped phase image is input to a phase×1/n multiplier section 716, which is an embodiment of the magnetic field inhomogeneity measurement means of the present invention. The phase×1/n multiplier section 716 multiplies the pixel values of the input phase image by 1/n (=4). Thus, a phase image as shown in FIG. 8(c) is obtained. This phase image corresponds to a phase image of the subject to be imaged 300 that consists only of water. Therefore, the phase image represents the strength distribution of the static magnetic field, or static magnetic field inhomogeneity.

The phase image representing the static magnetic field inhomogeneity is input to a phase correction section 718, which is an embodiment of the phase-correction means of the present invention. The phase correction section 718 is also supplied with the phase image from the phase image producing section 704, which is a phase image of water and fat containing a phase error due to the static magnetic field inhomogeneity. The phase correction section 718 corrects the phase error in the phase image of water and fat using the phase image representing the static magnetic field inhomogeneity.

Figure 9C:
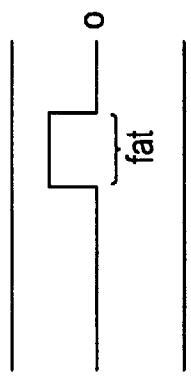
Figure 9B:
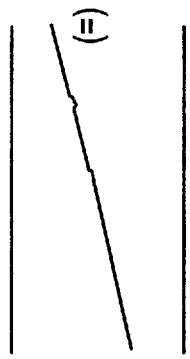
Figure 9A:
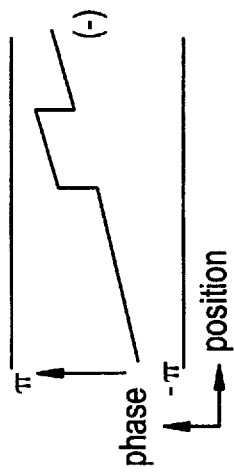

Specifically, as shown in FIG. 9, the pixels in the phase image representing the static magnetic field inhomogeneity (b) is subtracted from the corresponding pixels in the phase image of water and fat containing the phase error (a) to generate a phase image not containing the phase error due to the static magnetic field inhomogeneity as shown in (c).

The corrected phase image is input to a complex image producing section 720. The complex image producing section 720 is also supplied with the power image from the power image producing section 702. The complex image producing section 720 produces a complex image based on the phase image and the power image. The real and imaginary parts of the complex image can be obtained as the cosine and since, respectively, of the power image data. It should be noted that the angle for use in the cosine and sine calculation is a phase angle.

The complex image is input to a phase modification section 722, which is an embodiment of the phase-modification means of the present invention. The phase modification section 722 modifies the phase of the complex image based on a histogram input from a histogram generating section 724.

Figure 10:
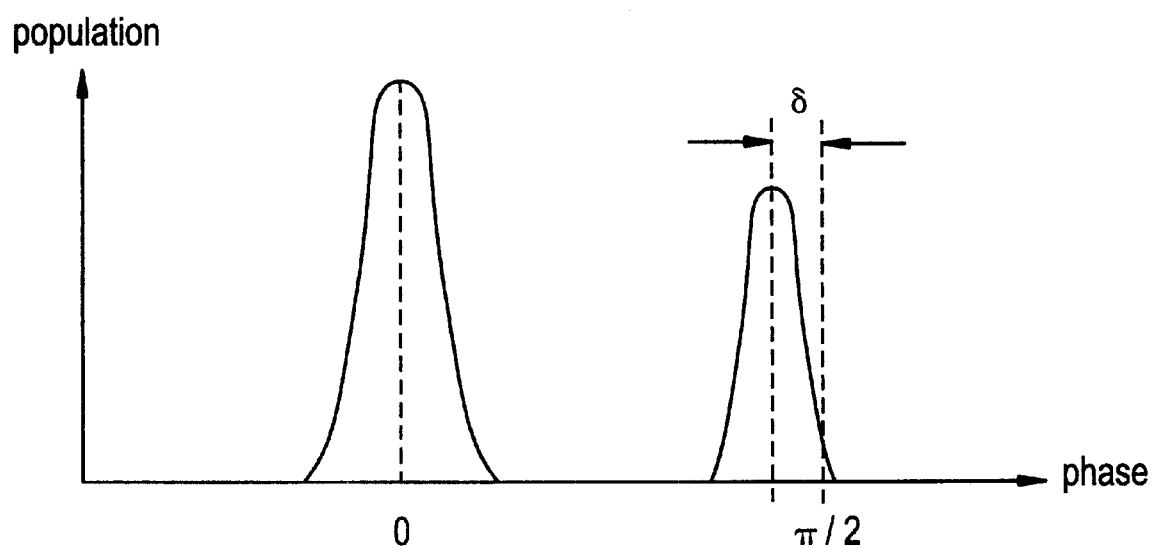
FIG. 10 is a graphic representation illustrating a histogram of the phase of a complex image.

The histogram generating section 724 generates a histogram of the phase of the complex image. Thus, a histogram as exemplarily shown in FIG. 10 is obtained. As shown, the histogram has two peaks. A portion having its peak at a phase of zero corresponds to water, and a portion having its peak near a phase of $\pi/2$ corresponds to fat.

Figure 11:
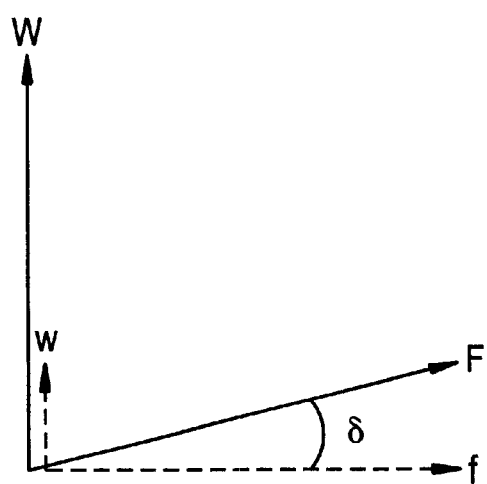
FIG. 11 is a vector diagram of water and fat signals.

Generally, since fat contains water in the same voxel, its peak in the phase histogram shifts from $\pi/2$. The reason is that a vector of fat signal F is the sum of a fat vector f and a water vector w, as exemplarily shown in FIG. 11. The phase modification section 722 modifies the phase of the fat image according to a peak shift δ of the histogram of fat. This provides the phase difference $\pi/2$ between the water and fat images.

The phase-modified complex image is input to a water/fat separation section 726, which is an embodiment of the image-producing means of the present invention. The water/fat separation section 726 produces a water image using the real part of the complex image and produces a fat image using the imaginary part. The water image produced is stored in a water image memory 728, and the fat image in a fat image memory 730.

Thus, according to the present invention, information representing static magnetic field inhomogeneity is acquired from an image obtained by one-time imaging operation, a phase error due to the static magnetic field inhomogeneity is corrected, and a water image and a fat image are separated using the image after being corrected for the phase error, therefore enabling imaging with water and fat separated to be performed very efficiently.

Many widely different embodiments of the invention may be configured without departing from the spirit and the scope of the present invention. It should be understood that the present invention is not limited to the specific embodiments described in the specification, except as defined in the appended claims.

What is claimed is:

1. A phase correction method comprising the steps of:
   obtaining a tomographic image of a subject with a static magnetic field using magnetic resonance with a timing echo of a specified duration to produce a first phase image having a phase difference of $2\pi/n$, wherein $n \geq 2$, between pixel data of water and fat;
   multiplying said first phase image of pixel data by n to produce a second phase image;
   lowpass filtering said second phase image to produce a third phase image;
   phase unwrapping said third phase image to produce a fourth phase image exceeding a range of between ±n ;
   multiplying the unwrapped fourth phase image by 1/n to obtain a fifth phase image representing an error due to a static magnetic field inhomogeneity; and
   correcting the phase of pixel data of said tomographic image by subtracting said fifth phase image representing said error due to static magnetic field inhomogeneity from said first phase image of water and fat to produce a sixth phase image of said water and fat without any error due to said static magnetic field inhomogeneity.

2. The method of claim 1, wherein n is equal to 4.

3. A phase correction apparatus comprising:
   means for obtaining a tomographic image of a subject with a static magnetic field using magnetic resonance with a timing echo of a specified duration to produce a first phase image having a phase difference of $2\pi$, wherein $n \geq 2$, between pixel data of water and fat;
   means for multiplying said first phase image of pixel data by n to produce a second phase image;
   means for lowpass filtering said second phase image to produce a third phase image;
   means for phase unwrapping said third phase image to produce a fourth phase image exceeding a range of between ±n ;
   means for multiplying the unwrapped fourth phase image by 1/n to obtain a fifth phase image representing an error due to a static magnetic field inhomogeneity; and
   means for correcting the phase of pixel data of said tomographic image by subtracting said fifth phase image representing said error due to static magnetic field inhomogeneity from said first phase image of water and fat to produce a sixth phase image of said water and fat without any error due to said static magnetic field inhomogeneity.

4. The apparatus of claim 3, wherein n is equal to 4.

5. A magnetic resonance imaging method comprising the steps of:
   obtaining a tomographic image of a subject with a static magnetic field using magnetic resonance with a timing echo of a specified duration to produce a first phase image having a phase difference of $2\pi/n$, wherein $n \geq 2$, between pixel data of water and fat;
   multiplying said first phase image of pixel data by n to produce a second phase image;
   lowpass filtering said second phase image to produce a third phase image;
   phase unwrapping said third phase image to produce a fourth phase image exceeding a range of between ±n;
   multiplying the unwrapped fourth phase image by 1/n to obtain a fifth phase image representing an error due to static magnetic field inhomogeneity;
   correcting the phase of pixel data of said tomographic image by subtracting said fifth phase image representing said error due to static magnetic field inhomogeneity from said first phase image of water and fat to produce a sixth phase image of said water and fat without any error due to said static magnetic field inhomogeneity; and
   separately producing a water image and a fat image using sixth phase image wherein the pixel data is corrected for error due to static magnetic field inhomogeneity.

6. The method of claim 5, wherein n is equal to 4.

7. The method of claim 5, further comprising the steps of:

generating a histogram having one peak of zero corresponding to water, and another peak of phase π/2 corresponding to fat;

modifying the phase difference in said phase corrected pixel data based on said histogram; and separately producing a water image and a fat image using the resulting modified phase difference.

8. The method of claim 7, wherein n is equal to 4.

9. A magnetic resonance imaging apparatus comprising:

imaging means for obtaining a tomographic image of a subject with a static magnetic field using magnetic resonance with a timing echo of a specified duration to produce a first phase image having a phase difference of 2π/n, wherein n≧2, between pixel data of water and fat;

multiplying means for phase multiplying said first phase image of pixel data by n to produce a second phase image;

filtering means for lowpass filtering said second phase image to produce a third phase image;

unwrapping means for phase unwrapping said third phase image to produce a fourth phase image exceeding a range of between ±n;

field inhomogeneity means for multiplying the unwrapped fourth phase image by 1/n to obtain a fifth phase image representing an error due to static magnetic field inhomogeneity;

phase correcting means for correcting phase of pixel data of said tomographic image by subtracting said fifth phase image representing said error due to static magnetic field inhomogeneity from said first phase image of water and fat to produce a sixth phase image of said water and fat without any error due to said static magnetic field inhomogeneity; and image producing means for separatey producing a water image and a fat image using said sixth phase image wherein the pixel data is corrected for error due to static magnetic field inhomogeneity.

10. The apparatus of claim 9, wherein n is equal to 4.

11. The apparatus of claim 9, further comprising:

means for generating a histogram having one peak of zero corresponding to water, and another peak of phase π/2 corresponding to fat;

means for modifying the phase difference in said phase corrected pixel data based on said histogram; and means for separately produce a water image and a fat image using the resulting modified phase difference.

12. The apparatus of claim 11, wherein n is equal to 4.

\* \* \* \* \*